US011030997B2

(12) United States Patent
Li et al.

(10) Patent No.: US 11,030,997 B2
(45) Date of Patent: Jun. 8, 2021

(54) SLIM EMBEDDING LAYERS FOR RECURRENT NEURAL LANGUAGE MODELS

(71) Applicant: Baidu USA, LLC, Sunnyvale, CA (US)

(72) Inventors: Zhongliang Li, Fairborn, OH (US); Shaojun Wang, San Jose, CA (US)

(73) Assignee: Baidu USA LLC, Sunnyvale, CA (US)

( * ) Notice: Subject to any disclaimer, the term of this patent is extended or adjusted under 35 U.S.C. 154(b) by 112 days.

(21) Appl. No.: 16/197,945

(22) Filed: Nov. 21, 2018

(65) Prior Publication Data

US 2019/0156817 A1 May 23, 2019

Related U.S. Application Data

(60) Provisional application No. 62/590,028, filed on Nov. 22, 2017.

(51) Int. Cl.
*G10L 15/06* (2013.01)
*G06N 3/08* (2006.01)
(Continued)

(52) U.S. Cl.
CPC ............ *G10L 15/063* (2013.01); *G06F 17/16* (2013.01); *G06F 40/123* (2020.01);
(Continued)

(58) Field of Classification Search
CPC ....... G10L 15/063; G10L 15/16; G06F 17/16; G06F 40/123; G06N 3/08; G06N 3/0445;
(Continued)

(56) References Cited

U.S. PATENT DOCUMENTS

2013/0272548 A1* 10/2013 Visser .................. G06K 9/4671 381/122
2014/0029839 A1* 1/2014 Mensink .............. G06K 9/6272 382/159
(Continued)

OTHER PUBLICATIONS

Goodman et al.,"Classes for fast maximum entropy training," In IEEE International Conference on Acoustics, Speech, and Signal Processing, (ICASSP), Retrieved from Internet: <https://ieeexplore.ieee.org/document/940893?arnumber=940893>, 2001. (2 pgs).
(Continued)

*Primary Examiner* — Andrew C Flanders
(74) *Attorney, Agent, or Firm* — North Weber & Baugh LLP

(57) ABSTRACT

Described herein are systems and methods for compressing or otherwise reducing the memory requirements for storing and computing the model parameters in recurrent neural language models. Embodiments include space compression methodologies that share the structured parameters at the input embedding layer, the output embedding layers, or both of a recurrent neural language model to significantly reduce the size of model parameters, but still compactly represent the original input and output embedding layers. Embodiments of the methodology are easy to implement and tune. Experiments on several data sets show that embodiments achieved similar perplexity and BLEU score results while only using a fraction of the parameters.

20 Claims, 12 Drawing Sheets

(51) Int. Cl.
*G10L 15/16* (2006.01)
*G06N 3/04* (2006.01)
*G06F 40/123* (2020.01)
*G06F 17/16* (2006.01)

(52) U.S. Cl.
CPC ............. *G06N 3/0445* (2013.01); *G06N 3/08* (2013.01); *G10L 15/16* (2013.01)

(58) Field of Classification Search
CPC ...... G06N 3/0454; G06N 3/084; G06N 3/082; H03M 7/42; H03M 7/30
See application file for complete search history.

(56) References Cited

U.S. PATENT DOCUMENTS

| | | | | |
|---|---|---|---|---|
| 2016/0247061 | A1* | 8/2016 | Trask | G06N 3/04 |
| 2017/0300828 | A1* | 10/2017 | Feng | G06N 20/00 |
| 2018/0240014 | A1* | 8/2018 | Strope | G06N 3/084 |
| 2019/0065594 | A1* | 2/2019 | Lytkin | G06F 16/9536 |
| 2019/0188212 | A1* | 6/2019 | Miller | G06F 16/285 |

OTHER PUBLICATIONS

Graff et al.,"English Gigaword," Idc2003t05. Linguistic Data Consortium, Philadelphia, 2003. (2 pgs).
Grave et al.,"Efficient softmax approximation for GPUs," arXiv preprint arXiv: 1609.04309, 2016. (11pgs).
Han et al.,"Deep Compression:Compressing deep neural networks with pruning, trained quantization and Huffman Coding," arXiv preprint arXiv:1510.00149, 2016. (14 pgs).
Irian et al.,"Tying word vectors and word classifiers: A loss framework for language modeling," arXiv preprint arXiv:1611.01462, 2016. (10 pgs).
Ji et al.,"Blackout: Speeding up recurrent neural network language models with very large vocabularies," arXiv preprint arXiv:1511.06909, 2015. (12 pgs).
Jozefowicz et al.,"Exploring the limits of language modeling," arXiv preprint arXiv:1602.02410, 2016. (11 pgs).
Kim et al.,"Character-Aware neural language models," arXiv preprint arXiv:1508.06615, 2015. (9 pgs).
Koehn et al.,"Moses: Open source toolkit for statistical machine translation," In Proceedings of the 45th annual meeting of the ACL on interactive poster and demonstration.
Bengio et al.,"Adaptive importance sampling to accelerate training of a neural probabilistic language model," IEEE Transactions on Neural Networks 19(4):713-722, 2008.(10pgs).
Bengio et al.,"A neural probabilistic language model," Journal of Machine Learning Research 3:1137-1155, 2003. (19 pgs).
Callison-Burch et al.,"Findings of the 2012 Workshop on Statistical Machine Translation," Proceedings of the 7th Workshop on Statistical Machine Translation, pp. 10-51, 2012 Association for Computational Linguistics, Retrieved from Internet<https://www.statmt.org/wmt12/pdf/WMT02.pdf>, 2012. (42 pgs).
Chelba et al.,"One billion word benchmark for measuring progress in statistical language modeling," arXiv preprint arXiv:1312.3005, 2013. (6 pgs).
Chen et al.,"Compressing neural networks with the hashing trick," In the 32nd International Conference on Machine Learning (ICML), 2285-2294, 2015 (10pgs).
Chen et al.,"Compressing neural language models by sparse word representations," The 54th Annual Meeting of the Association for Computational Linguistics, 226-235, 2016(10pgs).
Dauphin et al.,"Language modeling with gated convolutional networks," arXiv preprint arXiv:1612.08083, 2016. (8 pgs).
Denil et al.,"Predicting parameters in deep learning," arXiv preprint arXiv: 1306.0543, 2013. (9 pgs).
Duchi et al.,"Adaptive subgradient methods for online learning and stochastic optimization," Journal of Machine Learning Research:2121-2159, 2011. (39 pgs) sessions, 177-180, Association for Computational Linguistics, 2007. (4 pgs).
Le et al.,"A simple way to initialize recurrent networks of rectified linear units," arXiv preprint arXiv:1504.00941, 2015. (9 pgs).
Li et al.,"LightRNN: Memory and computation-efficient recurrent neural networks," In Advances in Neural Information Processing Systems, 4385-4393, 2016. (9 pgs).
Ling et al.,"Finding function in form: Compositional character models for open vocabulary word representation," arXiv preprint arXiv: 1508.02096, 2015. (11pgs).
Marcus et al.,"Building a large annotated corpus of English: The Penn Treebank," Computational linguistics 19(2):313-330, 1993. (18 pgs).
Mikolov et al.,"Extensions of recurrent neural network language model," In IEEE International Conference on Acoustics,Speech and Signal Processing (ICASSP),5528-5531,2011(4pgs).
Mikolov et al.,"Distributed representations of words and phrases and their compositionality," Retrieved from Internet: <https://papers.nips.cc/paper/5021-distributed-representations-of-words-and-phrases-and-their-compositionality.pdf>, 2013. (9 pgs).
Mnib et al.,"A fast and simple algorithm for training neural probabilistic language models," In the 29th Int'l.Conference on Machine Learning (ICML),1751-1758, 2012. (8pgs).
Press et al.,"Using the output embedding to improve language models," In Proceedings of the 15th Conference of the European Chapter of the Association for Computational Linguistics: vol. 2, Short Papers, 157-163. Association for Computational Linguistics, 2017. (7pgs).
Shazeer et al.,"Outrageously large neural networks: The sparsely-gated mixture-of-experts layer," arXiv preprint arXiv:1701.06538, 2017. (19 pgs).
Suzuki et al.,"Learning compact neural word embeddings by parameter space sharing," The 25th International Joint Conference on Artificial Intelligence, (IJCAI), 2046-2052, UCAI/ AAAJ, 2016. (7 pgs).
Tan et al.,"A scalable distributed syntactic, semantic, and lexical language model," Computational Linguistics 38(3):631-671, 2012. (42 pgs).
Zaidan et al.,"Z-MERT: A fully configurable open soutee tool fot minimum error rate training of machine translation systems," Retrieved from Internet: <http://citeseerx.ist.psu.edu/viewdoc/download?doi=10.1.1.175.8220&rep=rep1&type=pdf>, 2009 (10 pgs).
Zaremba et al.,"Recurrent neutal network regularization," arXiv preprint arXiv:1409.2329, 2014. (5pgs).
Zilly et al.,"Reeutrent highway networks," arXiv preprint arXiv:1607.03474, 2016. (10 pgs).

* cited by examiner

100

800

900

1000

1100

SLIM EMBEDDING LAYERS FOR RECURRENT NEURAL LANGUAGE MODELS

CROSS-REFERENCE TO RELATED APPLICATION

This application claims the priority benefit under 35 USC § 119(e) to U.S. Provisional Patent Application No. 62/590,028, filed on 22 Nov. 2017, entitled "SLIM EMBEDDING LAYERS FOR RECURRENT NEURAL LANGUAGE MODELS," and listing Shaojun Wang and Zhongliang Li as inventors. The aforementioned patent document is incorporated by reference herein in its entirety.

STATEMENT AS TO RIGHTS TO INVENTIONS MADE UNDER FEDERALLY SPONSORED RESEARCH AND DEVELOPMENT

This invention was made with government support under grant FA9550-10-1-0335 awarded by Air Force Office of Scientific Research, under grant IIS:RI-small 1218863 awarded by National Science Foundation, and under grant FA2386-13-1-3023 awarded by US Department of Defense. The government has certain rights in the invention.

BACKGROUND

A. Technical Field

The present disclosure relates generally to systems and methods for computer learning that can provide improved computer performance, features, and uses. More particularly, aspects of the present disclosure comprise methodologies to significantly reduce memory size of models to allow for reduced overhead, wider deployment, easier use, among other benefits.

B. Background

Neural language models are currently explored widely for language modeling. These models encode words as vectors (word embeddings) and then feed them into the neural network. The word vectors are normally trained together with the model training process. In the output layer, the hidden states are projected to a vector with the same size as the vocabulary, and then a softmax function translates them into probabilities.

Training neural language models is time consuming, mainly because it requires estimating the softmax function at every time stamp. There have been many efforts that try to reduce the time complexity of the training method. It is also desirable to train language models with relative compact sizes such that the models may be easier for deployment in real world systems.

Accordingly, what is needed are systems and methods that allow compression for at least some of the parameters of recurrent language models, which improves the functioning, use, and deployability of models on computing devices. Such systems and methods may be used to provide or improve computing device services, such as, by way of example, automatic speech recognition (ASR), machine translation, and image captioning, which in turn helps improve performance of, use of, and interfacing with computing devices.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments. Items in the figures may not be to scale.

DETAILED DESCRIPTION OF EMBODIMENTS

Figure 1:
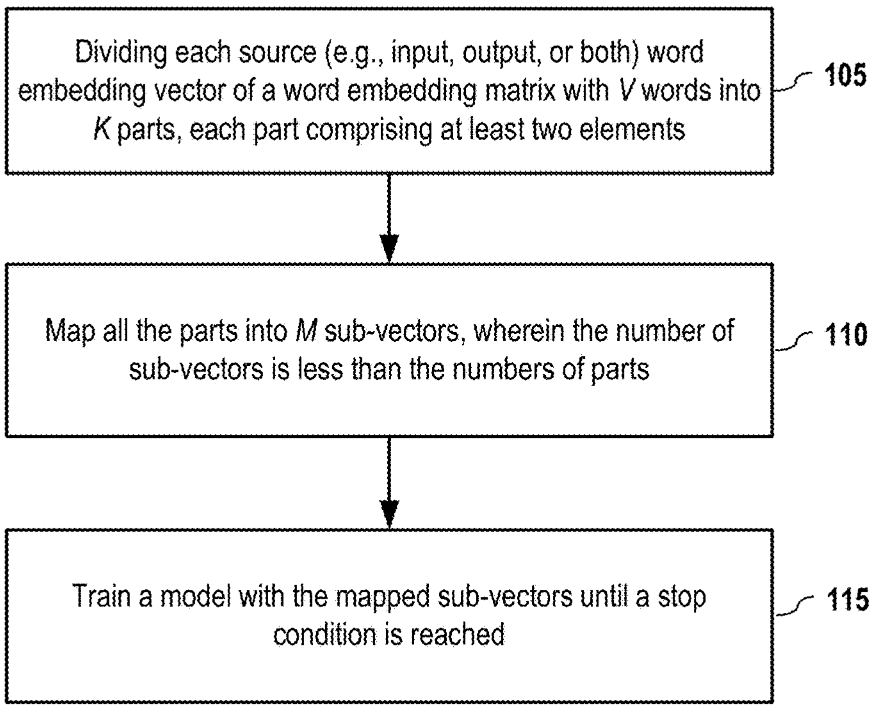
FIG. 1 depicts a computer-implemented method for parameter reduction in one or more embedding layers for a neural network model according to embodiments of the present disclosure.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

The terms "include," "including," "comprise," and "comprising" shall be understood to be open terms and any lists the follow are examples and not meant to be limited to the listed items. Any headings used herein are for organizational purposes only and shall not be used to limit the scope of the description or the claims. Each document mentioned in this patent disclosure is incorporate by reference herein in its entirety.

Furthermore, one skilled in the art shall recognize that: (1) certain steps may optionally be performed; (2) steps may not be limited to the specific order set forth herein; (3) certain steps may be performed in different orders; and (4) certain steps may be done concurrently.

A. INTRODUCTION

Neural language models are currently the state-of-the-art model for language modeling. These models encode words as vectors (i.e., word embeddings) and then feed them into the neural network. The word vectors are normally trained together with the model training process. In the output layer, the hidden states are projected to a vector with the same size as the vocabulary, and then a softmax function translates them into probabilities.

Training neural language models is time consuming, mainly because it requires estimating the softmax function at every time stamp. There have been many efforts that try to reduce the time complexity of the training method, such as hierarchical softmax, importance sampling (IS), and noise contrastive estimation (NCE). It is also desirable to train very compact language models for several reasons, including but not limited to: (1) Smaller models are easier to use and deploy in real world systems. If the model is too large, it is possible that it will need multiple server nodes. (2) Mobile devices have limited memory and space, which makes it impossible to use large models without server access. (3) Smaller models also decrease the communication overhead of distributed training of the models.

It has been shown that there can be significant redundancy in the parametrization of deep learning models. Various pruning and parameter reduction methods have been proposed. In general, there are two types of neural network compression techniques. The first approach involves retraining. First, a full-size model is trained, and its weights are pruned. Then, the model is retrained. The second approach is to encode parameter sharing into the model and directly train the compressed model, such as HashNet (which is described in Chen et al., *Compressing Neural Networks With The Hashing Trick*, In The $32^{nd}$ International Conference on Machine Learning (ICML), pages 2285-2294 (2015)) and LightRNN (which is described in Li et al., *LightRNN: Memory and Computation—Efficient Recurrent Neural Networks*, In Advances In Neural Information Processing Systems, pages 4385-4393 (2016)). Of the two approaches, embodiments of the current patent disclosure are closer to the latter approach.

The input layer and output layer contain the largest portion of parameters in neural language models since the number is dependent on the vocabulary size. In embodiments, reducing the number of parameters in one or more of the embedding layers is mainly focused. Relatively straightforward space efficient model compression embodiments that shares structured parameters are presented; the various embodiments may be used in the input layer, the output layer, or both. Also, embodiments are easy to implement and tune. Embodiments may also be viewed as a regularization that lead to improved performance on perplexity and BLEU (bilingual evaluation understudy) scores in certain cases.

B. RELATED WORK

There are many efforts that seek to improve the space efficiency of neural language models. Some work with character level input, and combine convolutional neural networks (CNN) with highway networks to reduce the number of parameters. Others extends the CNN embedding idea to the output layer, use a new CNN softmax layer, and also scale the method to a one billion word corpus. Yet others introduced a model for constructing vector representations of words by composing characters using bidirectional LSTMs.

Although the above models use the character level information to reduce the model size of embedding layers, there have been many approaches that try to reduce the parameters without using this additional information. Some introduce a compression layer between the recurrent layer and the output layer, which not only reduces the number of parameters in the output layer, but also reduces the time complexity of training and inference. Some improve the hierarchical softmax by assigning word clusters with different sizes of embeddings; they try to utilize the power of graphic processor unit (GPU) computation more efficiently, but also reduce the number of parameters significantly.

Others propose representing rare words by sparse linear combinations of common already learned ones. The sparse code and embedding for each word are precomputed and are fixed during the language model training process. Embodiments proposed herein are different for at least the reasons that that the codes for each word are selected randomly or otherwise, and the embeddings are learned in the process of model training, and the sub-vectors are concatenated together to form the final word embedding.

Li et al., mentioned above, used two-component shared embedding as the word representation in LightRNN. LightRNN uses parameter sharing to reduce the model size, which may be considered similar to embodiments presented herein. However, at least one difference is that the two components for a word are fed into an RNN in two different time stamps in LightRNN.

Embodiments herein may be understood as introducing weight sharing into the embedding layers for language models, which may be considered related to HashNet, but uses at least different sharing schemes and different sharing structures.

C. EMBODIMENTS OF PARAMETER SHARING AT INPUT AND/OR OUTPUT EMBEDDING LAYERS

In this section, embodiments of the parameter sharing at an input embedding layer, an output embedding layer, or both are presented. In one or more embodiments, deep long short-term memory (LSTM) is used as the neural language model. In each time stamp t, the word vector $h_t^0$ is used as the input. Subscripts are used to denote time stamps and superscripts to denote layers. Assume L is the number of layers in deep LSTM neural language model, then $h_t^L$ is used to predict the next word $y_t$. The dynamics of an LSTM cell are:

$$\begin{pmatrix} i \\ f \\ o \\ g \end{pmatrix} = \begin{pmatrix} sigm \\ sigm \\ sigm \\ \tanh \end{pmatrix} T_{2n,4n} \begin{pmatrix} D(h_t^{l-1}) \\ h_{t-1}^l \end{pmatrix} \quad (1)$$

$$c_t^l = f \odot c_{t-1}^l + i \odot g \quad (2)$$

$$h_t^l = o \odot \tanh(c_t^l) \quad (3)$$

In the formula, $\odot$ is element-wise multiplication, $T_{n,m}$: $\mathbb{R}^n \rightarrow \mathbb{R}^m$ is an affine transform, and D is the dropout operator that sets a random subset of its argument to zero.

Assuming the vocabulary size is V, and both the word vector size and the number of hidden nodes in the recurrent hidden states are N, then the total number of parameters in the embedding layer is N*V. The embedding layers of character-level models are related in that the word embeddings between different words are dependent on each other. Thus, updating the word embedding for each word will affect the embeddings for other words. Dependent word embedding helps reduce the number of parameters tremendously. In discussed in this patent document, model compression embodiments are designed that allow the input word embedding layer and softmax output layer to share weights to effectively reduce the model size and yet maintain the performance.

FIG. 1 depicts a computer-implemented method 100 for parameter reduction in one or more embedding layers for a neural network model according to embodiments of the present disclosure. In step 105, each source word embedding vector of a word embedding matrix with V words is divided into K parts with each part or sub-vectors comprising at least two elements. In embodiments, the source word embedding vector is an input word embedding vector or an output word embedding vector. In step 110, all the parts (V*K) are mapped into M sub-vectors. M is a number less than V*K, such that at least two parts are mapped to the same sub-vector, thus the parameters in the word embedding matrix can be compressed. Some embodiments of compressing input and output embedding layers are described later in this disclosed. In step 115, the neural network model is trained with the mapped sub-vectors until a stop condition is reached. The stop condition may be a number of iterations, a threshold of error rate, convergence of error values, etc.

1. Embodiments of Compressing Input Embedding Layer

Figure 2:
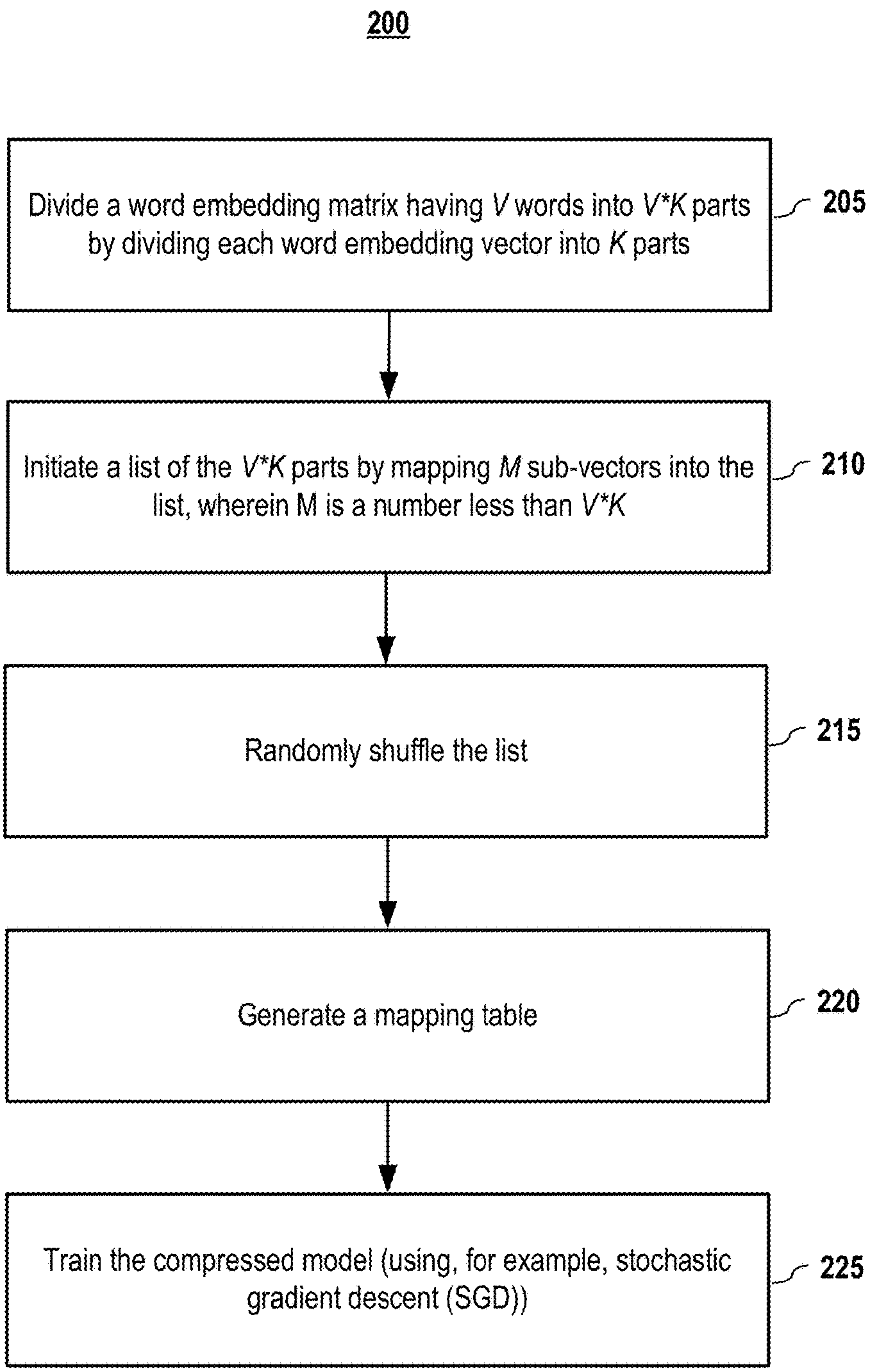
FIG. 2 depicts a method of parameter reduction with random shuffling and mapping for one or more embedding layers according to embodiments of the present disclosure.

FIG. 2 depicts a method of parameter reduction with random shuffling and mapping for one or more embedding layers, according to embodiments of the present disclosure. In step 205, in one or more embodiments, if the input word embedding vector $h_t^0 \in \mathbb{R}^N$ is divided into K even parts, the input representation of the current word is the concatenation of the K parts $h_t^0=[a_1, \ldots, a_K]$, and each part is a sub-vector with $$\frac{N}{K}$$

parameters ( $$\frac{N}{K}$$

is larger than 1). For a vocabulary of V words, the input word embedding matrix thus is divided into V*K parts or sub-vectors, and these parts are, in one or more embodiments, mapped into M sub-vectors randomly but as uniformly as possible, with M being a number less than V*K. For example, in embodiments, a list L with K*V elements is initialized (210) with the list containing $$\frac{K*V}{M}$$

copies of the sequence [1 . . . M]. Then, the list is randomly shuffled (215). In embodiments, the shuffling process may be done with the Fisher-Yates shuffle algorithm and the ith word's vector is formed with $[a_{L_{K*(i-1)+1}} \ldots a_{L_{K*i}}]$. This helps to make sure that the numbers of times each sub-vector is used are nearly equal.

In this way, the total number of parameters in the input embedding layer is $$M*\frac{N}{K}$$

instead of V*N, which makes the number of parameters independent from the size of vocabulary. The K sub-vectors for each word may be drawn randomly from the set of M sub-vectors. In one or more embodiments, a mapping table is generated (220) to associate the V words with corresponding mapped sub-vectors.

Figure 3:
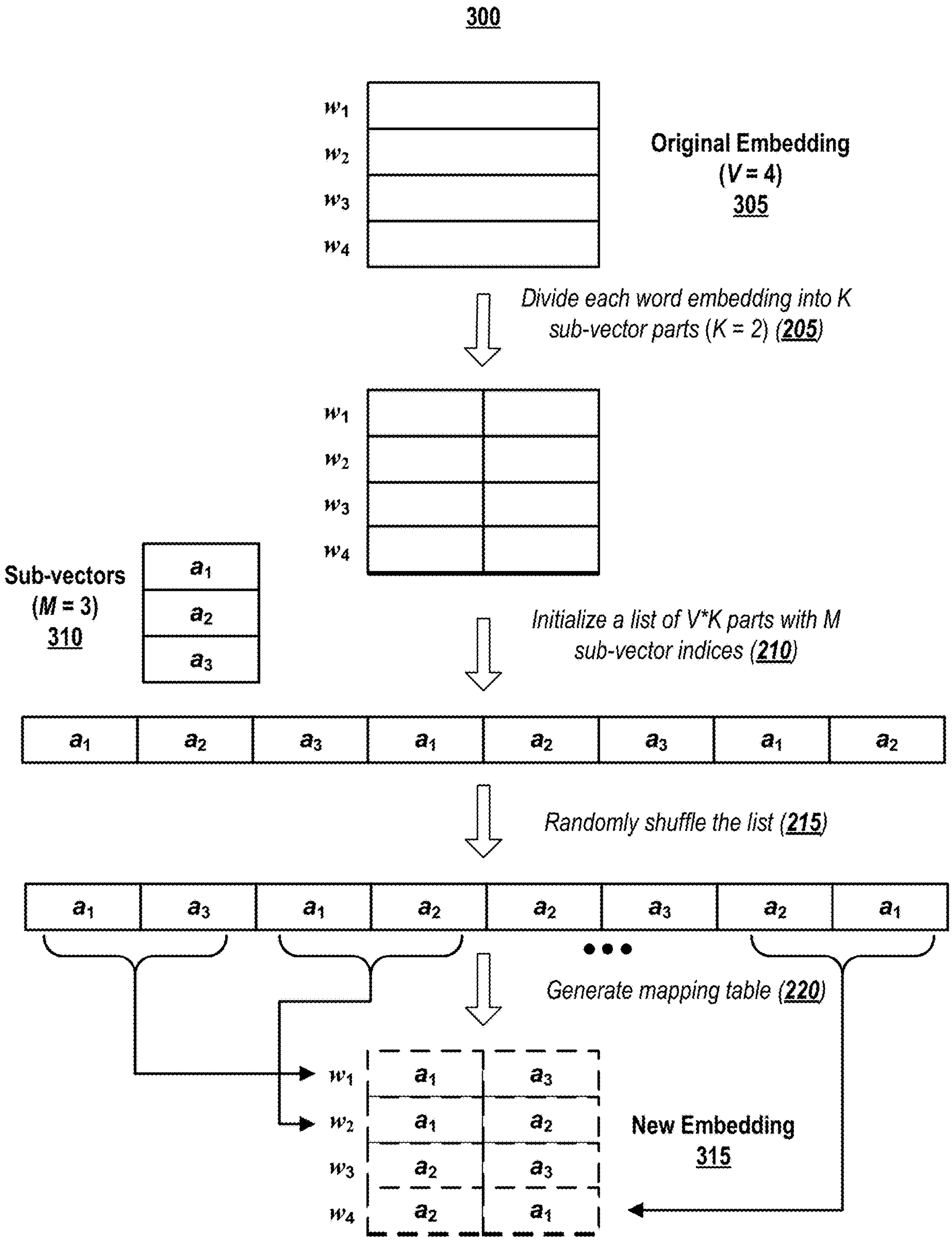
FIG. 3 depicts a simplified example of an original embedding layer and a new embedding layer according to embodiments of the present disclosure.

Consider the example as shown in FIG. 3, if in total there are four words (V=4) in the corpus 310, and each word vector is formed by two sub-vectors (K=2), and therefore there are in total eight sub-vectors in the input embedding matrix, assume that these eight sub-vectors are mapped into three sub-vectors (M=3) 310, which are indexed as $a_i$, i∈(1, 2, 3). In one or more embodiments, the concatenated word vector has the same size as the original one. In one or more embodiments, following initializing a list and shuffling the list, the word vectors may be mapped or assigned as follows: $[a_1, a_3]$, $[a_1, a_2]$, $[a_2, a_3]$, and $[a_2, a_1]$ and therefore a new embedding 315 is formed. That is, in embodiments, the assignment of sub-vectors to each word are randomly selected and fixed before the training process. In this example, the compression ratio is 3/8, and the number of parameters in the new embedding layer size is only 37.5% of the original one. In one or more embodiments, the mapping table is fixed during training process, but the parameters in the sub-vectors are updated.

If the number of sub-vectors is large enough and none of the word vectors share sub-vectors, then the input embeddings will become equivalent to normal word embeddings.

In embodiments, the neural network model with compressed word embedding layer is trained (230) until a stop condition is reached. In embodiments, stochastic gradient descent with back-propagation through time may be used to train the compressed neural language model. During each iteration of the training process, all words that share the same sub-vectors M with the current word will be affected. If one assumes that the number of words that share sub-vectors is small, then only a small number of word embedding vectors will be affected.

Even though the sub-vectors are randomly assigned and fixed during training, experiments on several datasets show good results, other approaches for assigning the sub-vectors may also be used. For example, in embodiments, a data-driven approach could pre-train an embedding matrix using, for example, Skipgram (Mikolov et al., *Distributed Representations of Words and Phrases and Their Compositionality*, Advances in Neural Information Processing Systems 26, Curran Associates, Inc., pages 3111-3119 (2013)), to get an estimate of sub-vectors, then use a clustering method to assign the sub-vectors, and finally run the training methodology proposed herein.

Figure 4:
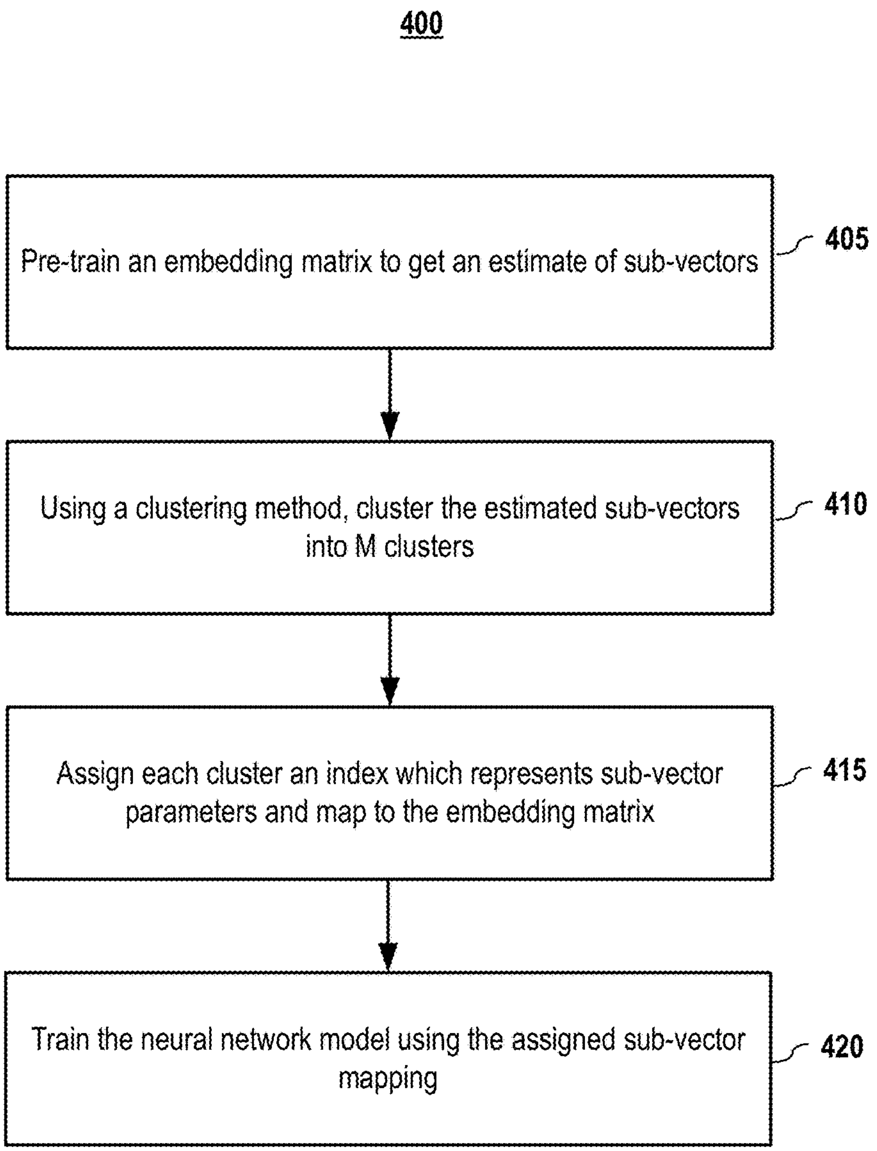
FIG. 4 depicts a method of parameters reduction with clustering for one or more word embedding layers according to embodiments of the present disclosure.

FIG. 4 depicts a method of parameters reduction with clustering for one or more word embedding layers according to embodiments of the present disclosure. In embodiments, an embedding matrix is pre-trained (405) to get an estimate of sub-vectors (or vectors that are divided into sub-vectors). The pre-trained sub-vectors are clustered (410), using a clustering method, into M clusters. Each of the sub-vectors in a cluster are assigned the same index, which represents the sub-vector parameters. The model is trained until a stop condition is reached with the assigned indexes be used to update the corresponding parts of the embedding matrix. In embodiments, stochastic gradient descent (SGD) with back-propagation through time may be used to train the compressed neural language model.

One of ordinary skill in the art may understand that the parameter sharing for the input word embedding layer may adopt one of the methods shown in FIG. 2 and FIG. 4, including modifications or extensions thereof, for compressing the input embedding layer.

2. Embodiments of Compressing Output Embedding Layer

It should be noted that the output embedding matrix may be compressed in similar ways as the input embedding layer. In the output layer, the context vector h is projected to a vector with the same size as the vocabulary, such that for each word w, $z_w$ is computed as: $z_W = h^T e_w$, which may then be normalized by a softmax non-linearity:

$$p(w) = \frac{\exp(z_w)}{\sum_{w' \in V} \exp(z_{w'})} \quad (4)$$

If each $e_w$ is treated as a word embedding (or, as may be referred to herein as an output embedding layer), similar parameter sharing techniques may then be used to those used in the input layer, and let $e_w = [a_{w1}, \ldots, a_{wK}]$ where $a_i$ are sub-vectors. In embodiments, the K sub-vectors may be mapped and randomly assigned using the same approach as the input embedding layer.

Figure 5:
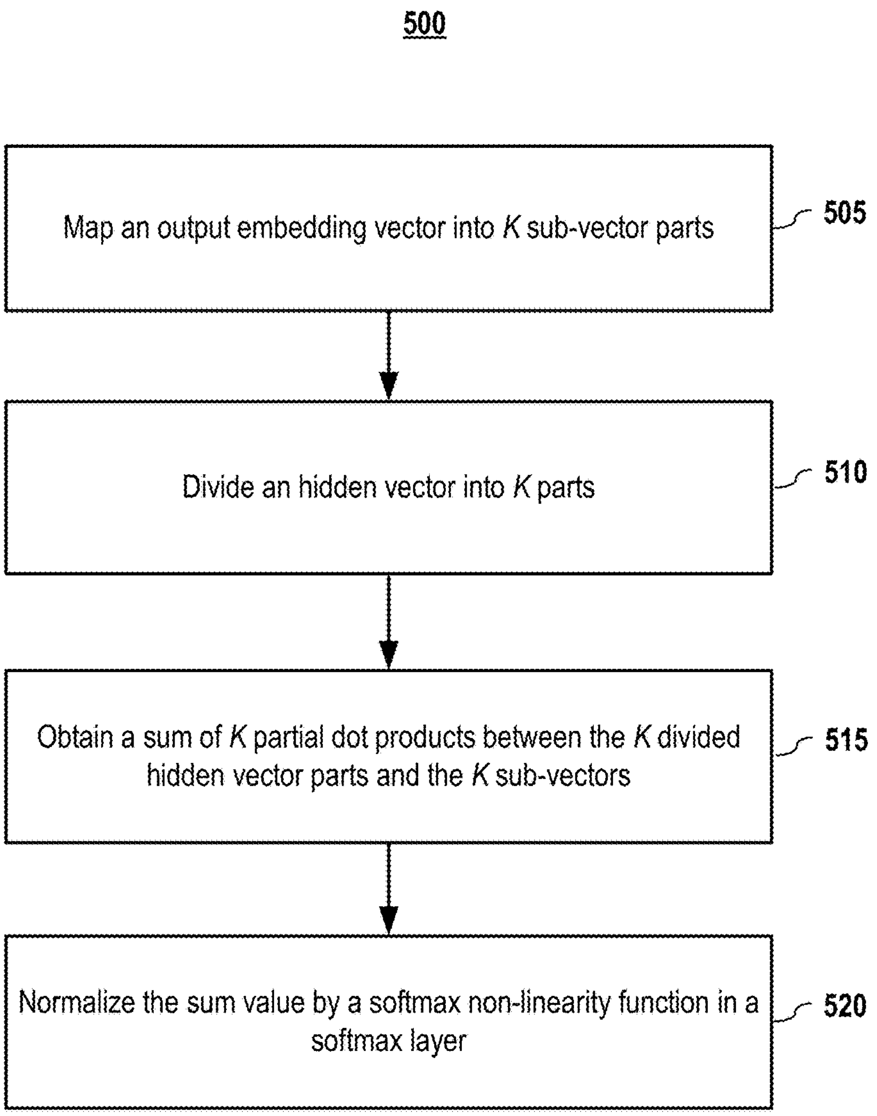
FIG. 5 depicts a method for training a neural network model with output embedding layer compressed according to embodiments of the present disclosure.
Figure 6:
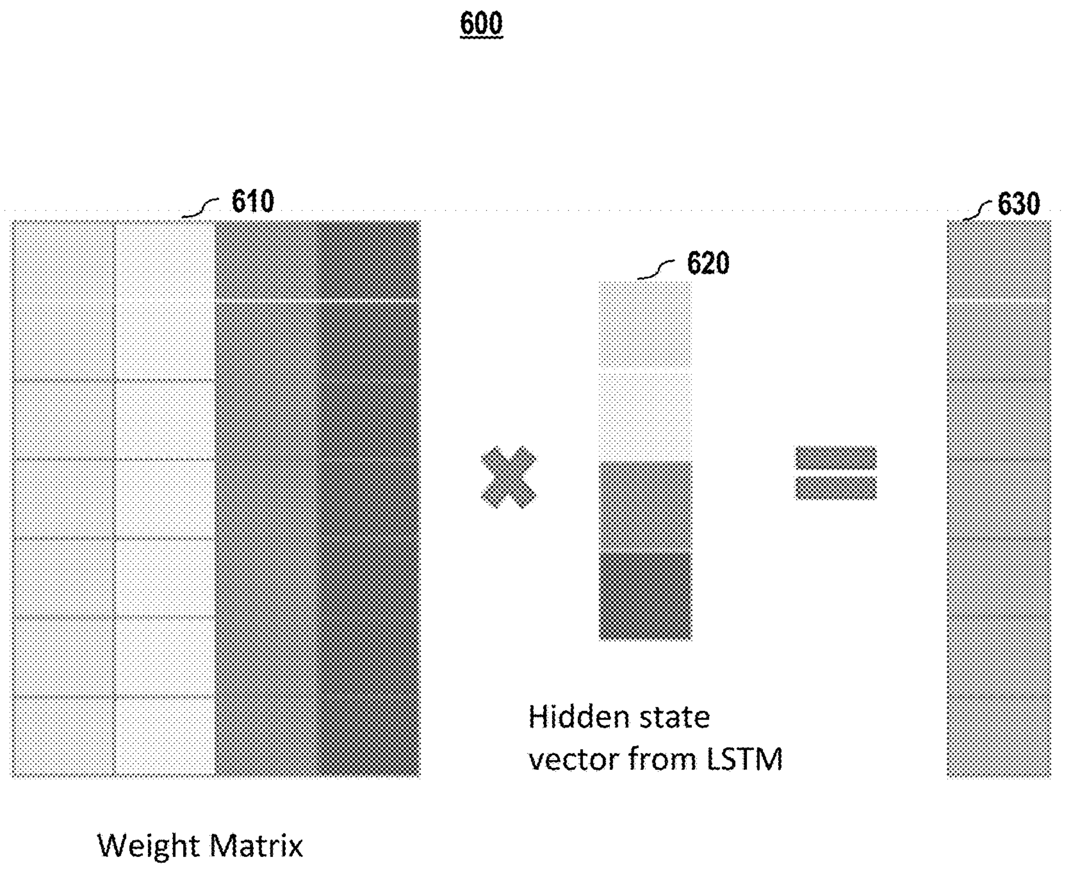
FIG. 6 depicts an illustration of output embedding layer compression according to embodiments of the present disclosure.

FIG. 5 depicts a method 500 for training a neural network model with the output embedding layer compressed, according to embodiments of the present disclosure. FIG. 6 depicts a graphical illustration 600 of output embedding layer compression, according to embodiments of the present disclosure.

The structured shared parameters in the output layer make it possible to speed up the computation during both training and inference. In one or more embodiments, each output word embedding $e_w$ is mapped (505) into K parts (sub-vectors). In one or more embodiments, the K parts are mutually exclusive (such as respectively selected from mutually exclusive sub-vector sets). For example, in one or more embodiments, let S be K sets of sub-vectors, $S_1$, $S_2$, . . . , $S_K$, such that $S_i \cup S_j = \emptyset$, $\forall_i \neq j$. In one or more embodiments, the first sub-vector in each word's embedding will be selected from $S_1$, the second from $S_2$, and so on. In one or more embodiments, the K sub-vectors may be mapped and randomly shuffled and assigned, or be assigned using a clustering method, or by using any extension or modification thereof.

In one or more embodiments, if the context vector (hidden vector) is also divided into K even parts $h = [h_1, \ldots, h_K]$, then $z_w$ corresponding to the embedding $e_w$ can be calculated as a sum of K partial dot products shown below:

$$z_w = \Sigma_{i=1}^{i=K} h_i^T a_{wi} \quad (5)$$

It can be seen that $h_i$ will only be multiplied by the sub-vectors in $S_i$. Because many words share the same sub-vectors, for each unique $h_i a_{wi}$, in one or more embodiments, the partial dot product is only needed to be computed once.

In step 520, the sum of K partial dot products is normalized by a softmax non-linearity function in a softmax layer to obtain a probability p(w) of the word embedding.

FIG. 6 depicts a graphical illustration 600 of output embedding layer compression, according to embodiments of the present disclosure. Each row ($e_w$) of the embedding matrix 610 is divided into K sub-vectors (4 sub-vectors as exemplarily shown in FIG. 6). Correspondingly, the hidden vector 620 is also divided into K parts, such that a matrix multiplication is able to be implemented to obtain a vector 630 with each element ($z_w$) of the vector 630 corresponding to a sum of K partial dot products. Since some output embedding parameters are shared, some elements of the embedding matrix 610 may be the same, and therefore result in the same partial dot product during the matrix multiplication operation. Consequently, the total number of unique dot products may be lessened for calculation simplification.

Figure 7:
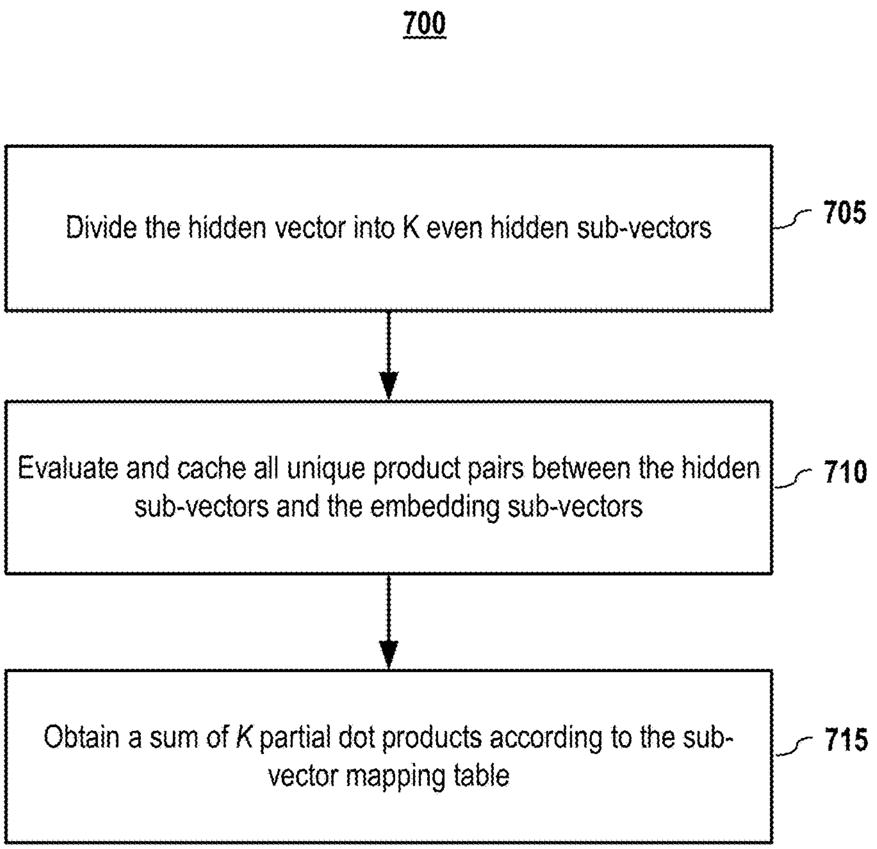
FIG. 7 a method to evaluating the new softmax layer with an inference method according to embodiments of the present disclosure.

In one or more embodiments, all $z_w$ may be evaluated using dynamic programming. For example, FIG. 7 depicts a method 700 to evaluating the new softmax layer with an inference algorithm, according to an embodiment of the present disclosure.

In step 705, the hidden vector h is divided into K even parts (hidden sub-vectors).

In step 710, all the unique $h_i a_{wi}$ values are first computed and cached. It is easy to see that the total number of unique dot product expressions will be the same as the total number of sub-vectors. The complexity of this step is $$O\left(\frac{MH}{K}\right),$$

where M is the total number of sub-vectors. This step can be done with K dense matrix multiplications. Thus, in this step, the partial dot product for each pair (between hidden state sub-vectors and embedding sub-vectors) is evaluated and cached.

In step 715, with all the unique dot product results obtained from the first step, each $z_w$ is obtained from the sum of K partial dot products according to the sub-vector mapping table. That is, because the dot product results are already known from the prior step, all that need be done is sum the K values for each word. The complexity of this step is O(VK).

In summary, the complexity of evaluating the new softmax layer will be $$O\left(\frac{MH}{K} + VK\right),$$

instead of O(V H) for the original softmax layer. In one or more embodiments, an inference method, such as the one listed below, may be used:

1. Divide the hidden vector h into K even parts;
2. Evaluate the partial dot products for each (hidden state sub-vector, embedding) pair and cache the results; and
3. Sum the result for each word according to the sub-vector mapping table.

D. CONNECTION TO HASHNET, LIGHTRNN, AND CHARACTER AWARE LANGUAGE MODEL

In this section, additional techniques are described and connections to HashNet, LightRNN, and character aware language model are described. One of the most similar work to certain embodiment disclosed method is the HashNet described in Chen et al. (2015, Compressing neural networks with the hashing trick. In The 32nd International Conference on Machine Learning (ICML), pages 2285-2294). In HashNet, all elements in a parameter matrix are mapped into a vector through a hash function. However in embodiments herein, sub-vectors—instead of single elements—are shared (and may be shared randomly). There are at least three advantages in these embodiments: 1) Such embodiments are more cache friendly: since the elements of the sub-vectors are adjacent, it is very likely that they will be in the same cache line, thus it accesses the memory more efficiently than HashNet, where the first step of the output layer computation is K dense matrix multiplications. 2) Such embodiments actually decrease the memory usage during training. When training Hashnet on GPUs, the parameter mapping is usually cached, thus saving no space. With the disclosed methodologies, it is possible to train models with 4096 hidden states on the BillionW dataset using one GPU, in which case the uncompressed output embedding is more than 12 GB when each number uses 32 bits. 3) As shown in the previous section, it is possible to use dynamic programming to reduce the time complexity of the output layer with a simple modification. If the sub-vector's size is equal to 1 (K=H), and the random shuffle is replaced with the hash function, then HashNet may be considered like a special case of an embodiment herein.

The presented approach differs from LightRNN (Li et al., 2016, *LightRNN:Memory and computation-efficient recurrent neural networks*, In Advances In Neural Information Processing Systems, pages 4385-4393) in at least the way that the presented approach is able to control the compression ratio to any arbitrary value, while LightRNN can only compress at the rate of square or cube root of vocabulary size, which could be too harsh in practical applications.

The character-aware language model can be explained as a parameter sharing word-level language model, where each word shares the same character embedding vectors and a convolutional neural network (CNN). Conversely this model can also be explained as a simplified character-aware language model from Kim et al. (2016, Character-aware neural language models, The 30th AAAI Conference on Artificial Intelligence (AAAI)); Jozefowicz et al. (2016, *Exploring the limits of language modeling*, arXiv preprint arXiv: 1602.02410). In the character-aware language model, each character in a word is first encoded as a character embedding, and then it uses a CNN to extract character n-gram features, and then these features are concatenated and fed through several layers of highway network to form the final word embedding. In this model, if the sequence of sub-vector ids (virtual characters) is treated as each word's representation, the word embedding then may be treated as concatenated unigram character feature vectors. The advantage of using the real character representation is that it can deal with out-of-vocabulary words nicely, but the cost is that the model is more complicated and to speed up inference, it needs to precompute the word embeddings for the words, so it could not stay in its compact form during inference. Embodiments proposed herein are much simpler and easier to tune. And during inference, they use much less space and can even decrease the complexity of inference. With the same space constraint, this will enable training language models with even larger number of hidden states.

E. EXPERIMENTS

It shall be noted that these experiments and results are provided by way of illustration and were performed under specific conditions using a specific embodiment or embodiments; accordingly, neither these experiments nor their results shall be used to limit the scope of the disclosure of the current patent disclosure.

The method of compressing the embedding layers is tested on various publicly available standard language model data sets ranging from the smallest corpus, PTB (Marcus et al., 1993, *Building a large annotated corpus of English: The penn treebank*, Computational linguistics 19(2): 313-330), to the largest, Google's BillionW corpus (Chelba et al., 2013, *One billion word benchmark for measuring progress in statistical language modeling*, arXiv preprint arXiv:1312.3005). 44 M is the 44 million word subset of the English Gigaword corpus (Graff and Cieri, 2003, English gigaword ldc2003t05, Linguistic Data Consortium, Philadelphia) used in Tan et al. (2012, A scalable distributed syntactic, semantic, and lexical language model. Computational Linguistics 38(3):631-671). The description of the datasets is listed in Table 1.

TABLE 1

| Corpus Statistics | | |
|---|---|---|
| Dataset | #Token | Vocabulary Size |
| PTB | 1M | 10K |
| 44M | 44M | 60K |
| WMT12 | 58M | 35K |
| ACLW-Spanish | 56M | 152K |
| ACLW-French | 57M | 137K |
| ACLW-English | 20M | 60K |
| ACLW-Czech | 17M | 206K |
| ACLW-German | 51M | 339K |
| ACLW-Russian | 25M | 497K |
| BillionW | 799M | 793K |

The weights are initialized with uniform random values between −0.05 and 0.05. Mini-batch stochastic gradient decent (SGD) is used to train the models. For all the datasets except the 44M corpus, all the non-recurrent layers except the word embedding layer to the LSTM layer use dropout. Adding dropout did not improve the results for 44M and BillionW, and so the no-dropout results are shown. Torch (Collobert et al., 2011, Torch7*: A matlab-like environment for machine learning*, In BigLearn, NIPS Workshop) is used to implement the models, and the code is based on the code open sourced from Kim et al. (2016, Character-aware neural language models, The 30th AAAI Conference on Artificial Intelligence (AAAI)). The models are trained on a single GPU. In the experiments, the dimension of the embeddings is the same as the number of hidden states in the LSTM model. Perplexity (PPL) is used to evaluate the model performance. Perplexity over the test set with length of T is given by:

$$PPL = \exp\left(-\frac{1}{T}\sum_{i=1}^{T}\log(p(w_i \mid w_{<i}))\right) \tag{6}$$

TABLE 2

| Test perplexities on PTB with 300 hidden nodes, K = 10 | | | |
|---|---|---|---|
| Model | Dropout | PPL | Size |
| NE | 0 | 89.54 | 1 |
| NE | 0.1 | 88.56 | 1 |
| NE | 0.2 | 88.33 | 1 |
| NE | 0.5 | 91.10 | 1 |
| SE (M = 20K) | 0 | 89.34 | 20% |
| SE (M = 20K) | 0.1 | 88.16 | 20% |
| SE (M = 10K) | 0 | 89.06 | 10% |
| SE (M = 10K) | 0.1 | 88.37 | 10% |
| SE (M = 6.25K) | 0 | 89.00 | 6.25% |
| SE (M = 5K) | 0 | 89.54 | 5% |

When counting the number of parameters, for convenience, the mapping table that maps each word to its sub-vector ids are not included. In all the experiments, the mapping table is fixed before the training process. For particularly large values of K, the mapping table's size could be larger than the size of parameters in its embedding layer. It is possible to replace the mapping table with hash functions that are done in HashNet (Chen et al., 2015, Compressing neural networks with the hashing trick. In The 32nd International Conference on Machine Learning (ICML), pages 2285-2294). End of sentence tokens are added to all the datasets with the exception of the experiments in table 4. Those experiments omit the end of sentence token for comparison with other baselines.

TABLE 3

| Test perplexities on PTB with 650 hidden nodes, K = 10 | | | |
|---|---|---|---|
| Model | Dropout | PPL | Size |
| NE | 0 | 85.33 | 1 |
| NE | 0.1 | 82.59 | 1 |
| NE | 0.2 | 83.51 | 1 |
| NE | 0.5 | 82.91 | 1 |
| SE (M = 10K) | 0 | 82.14 | 10% |
| SE (M = 5K) | 0 | 82.41 | 5% |
| SE (M = 5K) | 0.1 | 81.14 | 5% |
| SE (M = 1K) | 0 | 82.62 | 1% |

TABLE 4

| PPL results in test set for various linguistic datasets on ACLW datasets. | | | | | | |
|---|---|---|---|---|---|---|
| Method | English/#P | Russian/#P | Spanish/#P | French/#P | Czech/#P | German/#P |
| HSM | 236/25M | 353/200M | 186/61M | 202/56M | 701/83M | 347/137M |
| C-HSM | 216/20M | 313/152M | 169/48M | 190/44M | 578/64M | 305/104M |
| LightRNN | 191/17M | 288/19M | 157/18M | 176/17M | 558/18M | 281/18M |
| SE | 187/7M | 274/19M | 149/8M | 162/12M | 528/17M | 261/17M |

Note that all the SE models just use 300 hidden states

Similar to the work in Jozefowicz et al. (2016*, Exploring the limits of language modeling*, arXiv preprint arXiv: 1602.02410), compressing the output layers turns out to be more challenging. The results are first reported when just compressing the input layer, and then report the results when both input layers and output layers are compressed. In the end, we do re-ranking experiments for machine translation.

TABLE 5

| Perplexity results for single models on BillionW. Bold number denotes results on a single GPU | | |
|---|---|---|
| Model | Perplexity | #P[Billions] |
| Interpolated Kneser-Ney 5-gram | 67.6 | 1.76 |
| 4-layer IRNN-512 | 69.4 | |
| RNN-2048 + BlackOut sampling | **68.3** | |
| Sparse Non-negative Matrix Language Model | 52.9 | 33 |
| RNN-1024 + MaxEnt 9-gram | 51.3 | 20 |
| LSTM-2048-512 | 43.7 | 0.83 |
| LightRNN | **66.0** | 0.041 |
| 2-layer LSTM-8192-1024 | 30.6 | 1.8 |
| 2-layer LSTM-8192-1024 + CNN inputs | 30.0 | 1.04 |

TABLE 5-continued

Perplexity results for single models on BillionW. Bold number denotes results on a single GPU

| Model | Perplexity | #P[Billions] |
|---|---|---|
| 2-layer LSTM-8192-1024 + CNN inputs + CNN softmax | 39.8 | 0.29 |
| LSTM-2048 Adaptive Softmax | **43.9** | >0.29 |
| 2-layer LSTM-2048 Adaptive Softmax | **39.8** | |
| GCNN-13 | **38.1** | |
| MOE | 28.0 | >4.37 |
| SE (2-layer 2048 LSTM NCE) | **39.9** | 0.32 |
| SE (3-layer 2048 LSTM NCE) | **39.5** | 0.25 |
| SE (3-layer 2048 LSTM IS) | **38.3** | 0.25 |

1. Experiments on Slim Embedding for Input Layer

For the input layer, two cases are compared. The first case is the one just using the original word embedding (NE), a second case is the one compressing the input embedding layer with different ratio (SE). The first case is a strong baseline that uses the same number of hidden states and uses the same full softmax layer and has much more number of parameters. The results on Penn Treebank (PTB) dataset are first reported. For PTB, the vocabulary size is 10K, and has 1 million words.

Tables 2 and 3 show the experimental results on PTB corpus when using 300 and 650 hidden nodes respectively. In both tables, the column Dropout denotes the dropout probability that is used from the input embedding layer to the LSTM layer, all other non-recurrent layers use dropout probability of 0.5 in both NE and SE. Size is the number of parameters in the compressed input word embedding layer relative to the original input word embedding. The experiment on the input layer shows the compression of the input layer has almost no influence on the performance of the model. The SE model with 650 hidden states manages to keep the PPL performance almost unchanged even when the input layer just uses 1% of trainable parameters. And when the input layer is trained with dropout, it gives better results than the baseline.

Figure 8:
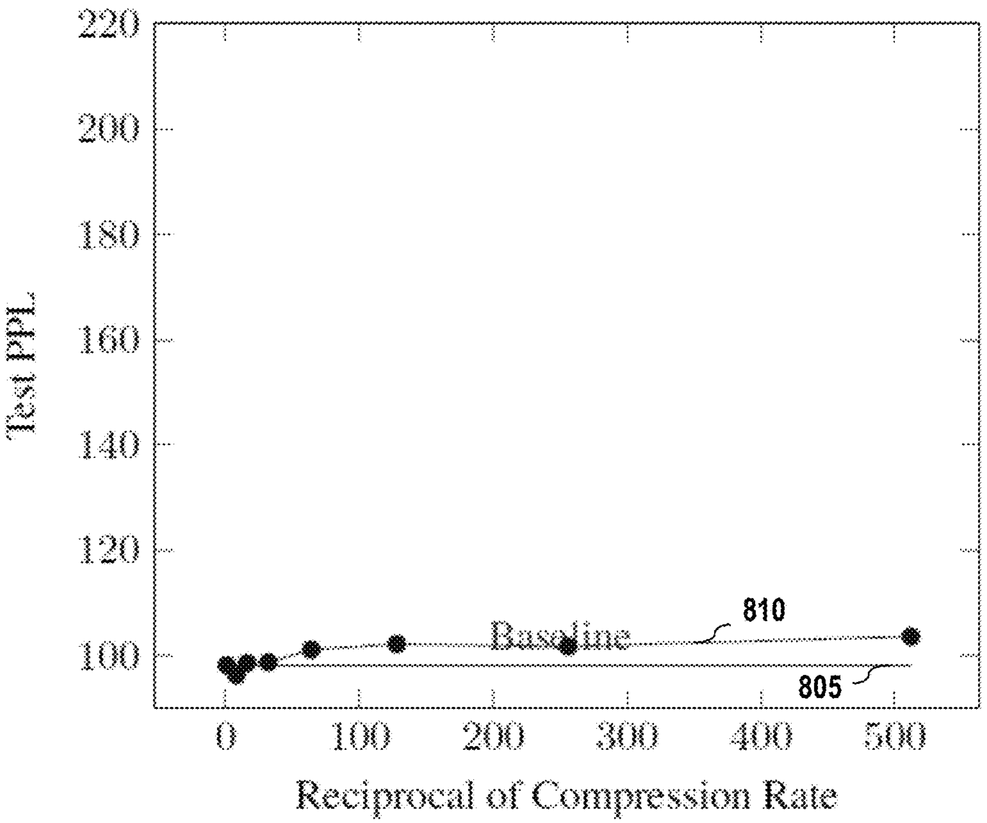
FIG. 8 depicts test perplexities on a model with 512 hidden nodes and each 512-dimensional input embedding vector was divided into eight parts with only the input word embedding layer compressed, according to an embodiment of the present disclosure.
Figure 9:
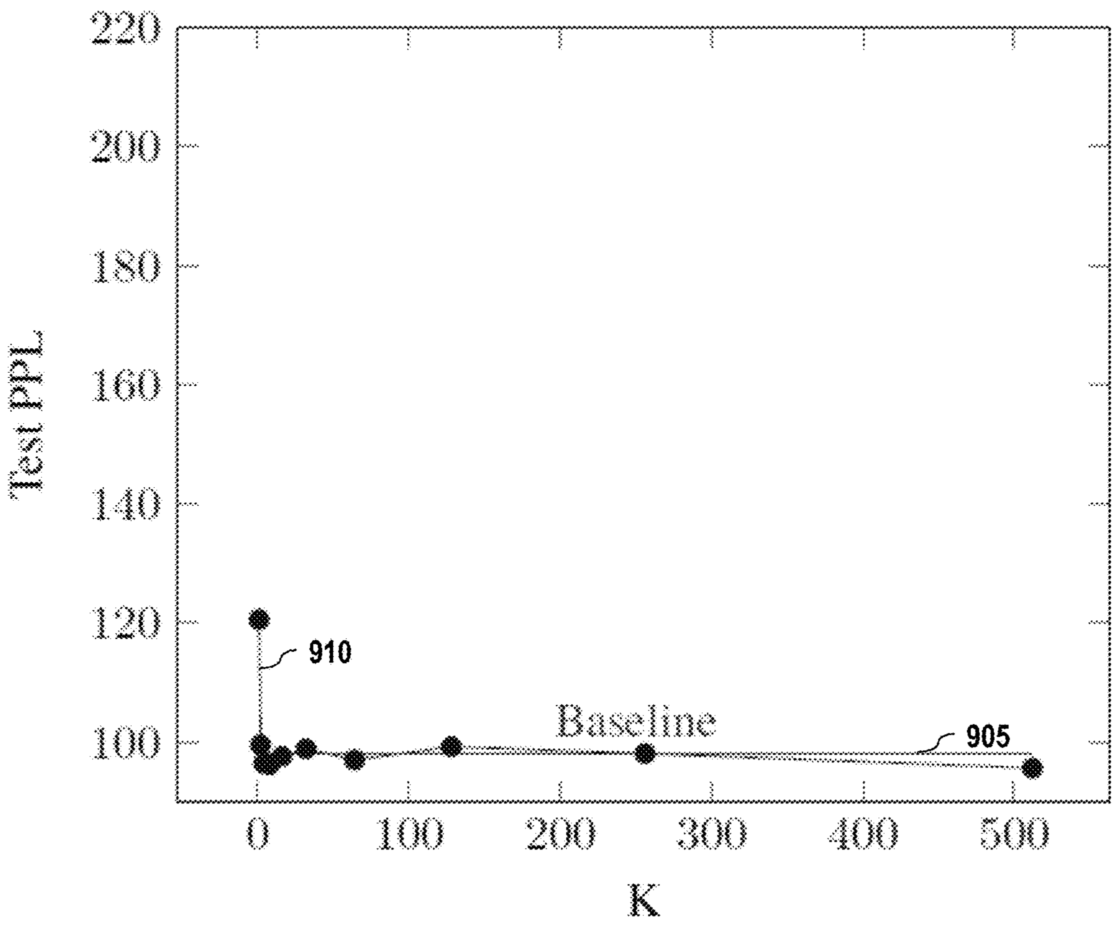
FIG. 9 depicts test perplexities on a model with 512 hidden nodes with ⅛ original size and only the input word embedding layer was compressed according to an embodiment of the present disclosure.

FIG. 8 and FIG. 9 are the results on a model with 44M giga world sub-corpus where 512 hidden notes are used in the two layers LSTM model. Baseline 805 and 905 denote the result using the original LSTM model, while lines 810 and 910 denote the result using the LSTM model with embedding compressed. FIG. 8 shows the perplexity results on the test datasets, where each word input embedding vector is divided into eight sub-vectors (K=8), and vary the number of new embedding sub-vectors, M, thus varying the compressed model size, i.e., compression ratio, from 1 to 1/512.

It can be seen that the perplexity results remain almost the same and are quite robust and insensitive to the compression ratio: they decrease slightly to a minimum of 96.30 when the compression ratio is changing from 1 to 1/8, but increase slightly to 103.61 when the compression ratio reaches 1/512. FIG. 9 shows the perplexity results where each word input embedding vector is divided into different numbers of sub-vectors from 1 to 512, and at the same time vary the number of sub-vectors, M, so as to keep the compression ratio constant (such as 1/8 in FIG. 9). It can be seen that the perplexity results remain almost the same. The results are quite robust and insensitive to the size of the sub-vector except in the case where each word contains only one sub-vector, i.e. K=1. In this case, multiple words share identical input embeddings, which leads to worse perplexity results as expected. When the dimension of input embedding is the same as the sub-vectors number of each embedding (K=512), it could be seen as a HashNet model that uses a different hash function, the PPL is 95.73. When xxhash is used to generate the mapping table (used in HashNet), the PPL is 97.35.

2. Experiments on Slim Embedding for Both and Output Input Layers

In this section experimental results are reported when both input and output layers are compressed using the presented proposed approach.

Figure 10:
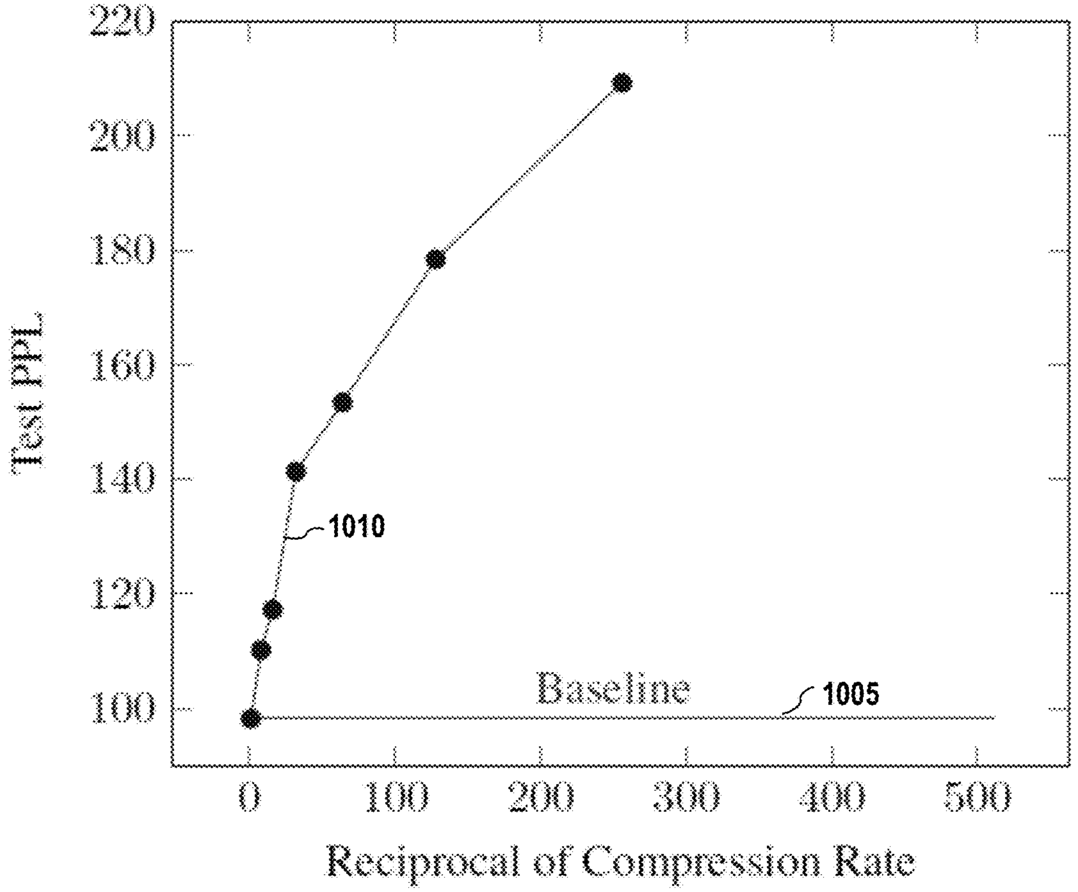
FIG. 10 depicts test perplexities on a model with 512 hidden nodes and each 512-dimensional input embedding vector was divided into eight parts with both the input and output embedding layers compressed, according to an embodiment of the present disclosure.
Figure 11:
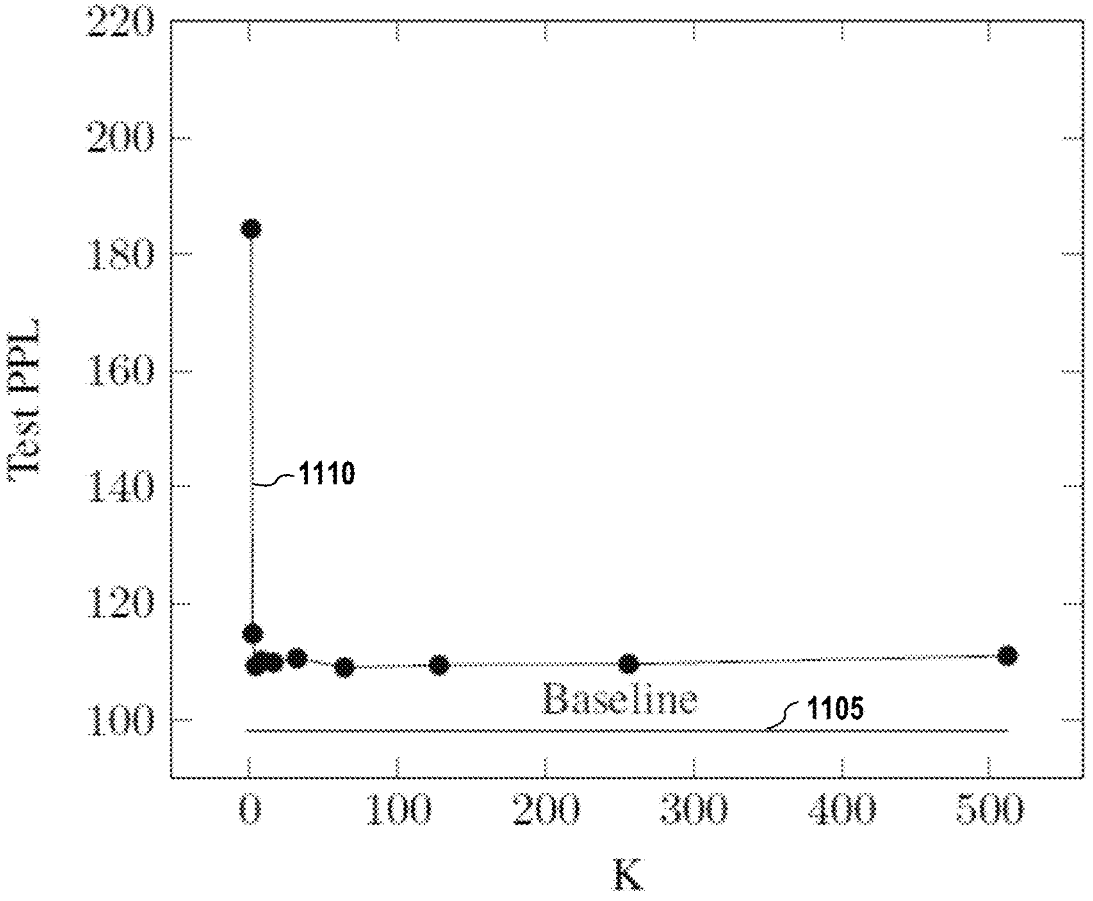
FIG. 11 depicts test perplexities on a model with 512 hidden nodes when embedding compressed to ⅛, according to an embodiment of the present disclosure.

FIG. 10 and FIG. 11 are the results on a model with the 44M corpus where 512 hidden nodes are used in the two layers of the LSTM model. Baselines 1005 and 1105 denote the result using the original LSTM model, while lines 1010 and 1110 denote the result using the LSTM model with embedding compressed. FIG. 10 shows the perplexity results 900 where each word input embedding vector is divided into eight sub-vectors (K=8), and vary the number of sub-vectors, M, thus varying the compression ratio, from 1 to 1/256.

Unlike the case when only the input embedding layer is compressed, it is found that the perplexity results become monotonically worse when the compression ratio is changed from 1 to 1/256. Similar to the case of only the input embedding layer being compressed, FIG. 10 shows the perplexity results where each word input embedding vector is divided into different sub-vectors from 1 to 512, and at the same time varying the size of sub-vectors M, to keeping compressing ratio constant (1/8 in FIG. 10). It is shown that the perplexity results almost remain the same, and reach a minimum when K=4, and are not sensitive to the size of the sub-vector except in the case where each word contains only one sub-vector. In that case, multiple words share identical input embeddings, which leads to expected bad perplexity result. When K=512, the PPL is 111.0, and when using xxhash, the PPL is 110.4. The results are also very close to HashNet.

Good perplexity results on PTB corpus are reported when parameter tying is used at both input and output embedding layers (which is described in Inan et al., *Tying word vectors and word classifiers: A loss framework for language modeling*, arXiv preprint arXiv:1611.01462; Press and Wolf, *Using the output embedding to improve language models*, arXiv preprint arXiv:1608.05859; Zilly et al., Recurrent highway networks, arXiv preprint arXiv:1607.03474; Zoph and Le, 2016, *Neural architecture search with reinforcement learning*, arXiv preprint arXiv:1611.01578). However further perplexity improvement is not observed when both parameter sharing and tying are used at both input and output embedding layers.

The model disclosed in this patent disclosure is compared to LightRNN, which also focuses on training very compact language models. It is found that NCE helps reduce the memory usage during the training process and also speeds up the training process. In the one billion word experiments, the total memory used on the GPU is about 7 GB, and is smaller if a larger compression rate is used. A fixed smoothed unigram distribution (unigram distribution raised to 0.75) is used as the noise distribution. Table 5 shows obtained results on the one billion word dataset. For the two-layer model, the compression rate for the input layer is 1/32 and the output layer is 1/8, with 322 million total numbers of parameters. For the three layer model, the compression rates for the input and output layer are 1/32 and 1/16 respectively, with 254 million total numbers of parameters. Both experiments using NCE take about seven days of training on a GTX 1080 GPU. Jozefowicz et al. suggests importance sampling (IS) could perform better than the NCE model, so the experiment was implemented with IS and 4000 noise samples were used for each mini-batch. The PPL decreased to 38.3 after training for 8 days. As being observed, the 3 layer model is the most compact recurrent neural language model that has a perplexity below 40 on this dataset.

3. Machine Translation Reranking Experiment

It is desirable to see whether the compressed language model will affect the performance of machine translation reranking. In this experiment, the Moses toolkit (which is described in Koehn et al., *Moses: Open source toolkit for statistical machine translation*, In Proceedings of the 45th annual meeting of the ACL on interactive poster and demonstration sessions. Association for Computational Linguistics, pages 177-180) is used to generate a 200-best list of candidate translations. Moses was configured to use the default features, with a 5-gram language model. Both the language and translation models were trained using the WMT12 data (which is described by Callison-Burch et al., *WMT '12: Proceedings of the Seventh Workshop on Statistical Machine Translation*, Association for Computational Linguistics, Stroudsburg, Pa., USA), with the Europarl v7 corpus for training, newstest2010 for validation, and newstest2011 for test, all lower-cased. The scores used for reranking were linear combinations of the Moses features and the language models. ZMERT (Zaidan, 2009, *Z-MERT: A fully configurable open source tool for minimum error rate training of machine translation systems*, The Prague Bulletin of Mathematical Linguistics 91:79-88) was used to determine the coefficients for the features.

A two layer LSTM language model with 512 hidden states and a compressed language model are trained. The compressed language model compresses the input layer to ⅛ and output layer to ¼ using NCE. For the baseline, the n-best list is reranked using only the Moses feature scores that include 5-gram having a perplexity of 251.7 on test data, yielding a BLEU score of 25.69. When the normal LSTM language model having a perplexity of 124 is added on test data as another feature, the BLEU score changed to 26.11. For the compressed language model having a perplexity 134 on test data, the BLEU score changed to 26.25, which only has a small difference with the normal LSTM language model.

F. VARIOUS CONCLUSIONS

In this patent disclosure, memory/space efficient structured parameter sharing methodologies are presented to compress embedding layers. It shall be noted that time used on both CPU and GPU show that inference time is shorter for embodiments of the present disclosure. In one or more embodiments, even though the sub-vectors are randomly assigned and fixed during training, experiments on several datasets show good results. A better data-driven approach may pre-train an embedding matrix using Skipgram to get an estimate of sub-vectors, then use a clustering method to assign the sub-vectors, and finally run the training methodology disclosed in this patent disclosure. Embedding layers have been used in many tasks of natural language processing, such as sequence to sequence models for neural machine translation and dialog systems. These techniques may be extended for use with these models.

G. SYSTEM EMBODIMENTS

In embodiments, aspects of the present patent disclosure may be directed to or implemented on information handling systems/computing systems. For purposes of this disclosure, a computing system may include any instrumentality or aggregate of instrumentalities operable to compute, calculate, determine, classify, process, transmit, receive, retrieve, originate, route, switch, store, display, communicate, manifest, detect, record, reproduce, handle, or utilize any form of information, intelligence, or data for business, scientific, control, or other purposes. For example, a computing system may be a personal computer (e.g., laptop), tablet computer, phablet, personal digital assistant (PDA), smart phone, smart watch, smart package, server (e.g., blade server or rack server), a network storage device, or any other suitable device and may vary in size, shape, performance, functionality, and price. The computing system may include random access memory (RAM), one or more processing resources such as a central processing unit (CPU) or hardware or software control logic, ROM, and/or other types of memory. Additional components of the computing system may include one or more disk drives, one or more network ports for communicating with external devices as well as various input and output (I/O) devices, such as a keyboard, a mouse, touchscreen and/or a video display. The computing system may also include one or more buses operable to transmit communications between the various hardware components.

Figure 12:
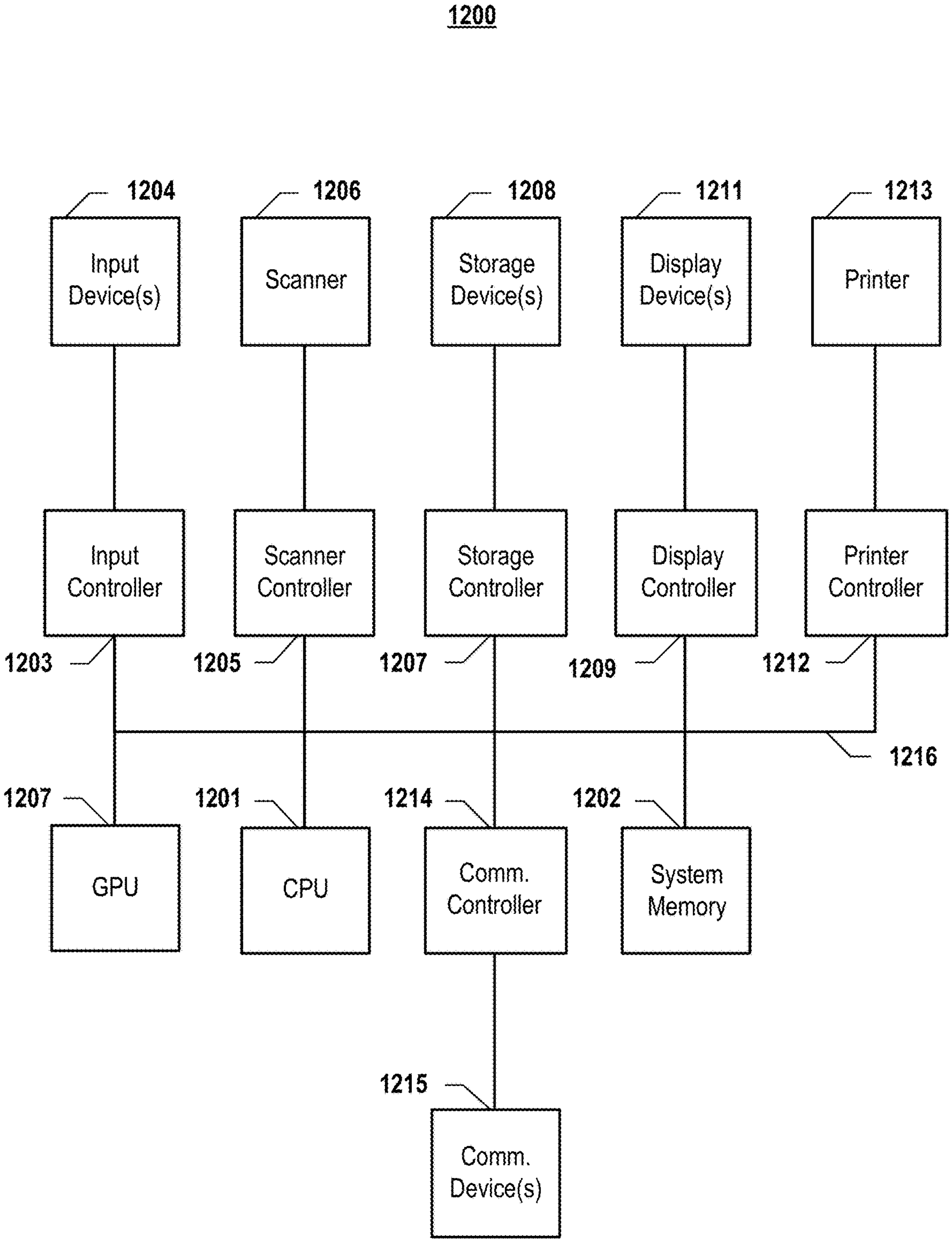
FIG. 12 depicts a simplified block diagram of a computing device/information handling system, in accordance with embodiments of the present document.

FIG. 12 depicts a simplified block diagram of a computing device/information handling system (or computing system) according to embodiments of the present disclosure. It will be understood that the functionalities shown for system 1100 may operate to support various embodiments of an information handling system—although it shall be understood that an information handling system may be differently configured and include different components.

As illustrated in FIG. 12, system 1200 includes one or more central processing units (CPU) 1201 that provides computing resources and controls the computer. CPU 1201 may be implemented with a microprocessor or the like, and may also include one or more graphics processing units (GPU) 1217 and/or a floating-point coprocessor for mathematical computations. System 1200 may also include a system memory 1202, which may be in the form of random-access memory (RAM), read-only memory (ROM), or both.

A number of controllers and peripheral devices may also be provided, as shown in FIG. 12. An input controller 1203 represents an interface to various input device(s) 1204, such as a keyboard, mouse, or stylus. There may also be a scanner controller 1205, which communicates with a scanner 1206. System 1200 may also include a storage controller 1207 for interfacing with one or more storage devices 1208 each of which includes a storage medium such as magnetic tape or disk, or an optical medium that might be used to record programs of instructions for operating systems, utilities, and applications, which may include embodiments of programs that implement various aspects of the present invention. Storage device(s) 1208 may also be used to store processed data or data to be processed in accordance with the invention. System 1200 may also include a display controller 1209 for providing an interface to a display device 1211, which may be a cathode ray tube (CRT), a thin film transistor (TFT) display, or other type of display. The computing system 1200 may also include a printer controller 1212 for communicating with a printer 1213. A communications controller 1214 may interface with one or more communication devices 1215, which enables system 1200 to connect to remote devices through any of a variety of networks including the Internet, a cloud resource (e.g., an Ethernet cloud, a Fiber Channel over Ethernet (FCoE)/Data Center Bridging (DCB) cloud, etc.), a local area network (LAN), a wide area network (WAN), a storage area network (SAN) or through any suitable electromagnetic carrier signals including infrared signals.

In the illustrated system, all major system components may connect to a bus 1216, which may represent more than one physical bus. However, various system components may or may not be in physical proximity to one another. For example, input data and/or output data may be remotely transmitted from one physical location to another. In addition, programs that implement various aspects of this invention may be accessed from a remote location (e.g., a server) over a network. Such data and/or programs may be conveyed through any of a variety of machine-readable medium including, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices.

Embodiments of the present invention may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present invention may further relate to computer products with a non-transitory, tangible computer-readable medium that have computer code thereon for performing various computer-implemented operations. The media and computer code may be those specially designed and constructed for the purposes of the present invention, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter. Embodiments of the present invention may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of the claims may be arranged differently including having multiple dependencies, configurations, and combinations.

What is claimed is:

1. A computer-implemented method for compressing a matrix of a neural network model, the method comprising:

for each vector from a set of vectors from the matrix, dividing the vector from the matrix into a plurality of parts;

for each part of the vector from the matrix, mapping the part to a substitute sub-vector, which comprises one or more parameters, wherein the substitute sub-vector is selected from a set of substitute sub-vectors, which set has fewer substitute sub-vectors than there are parts mapped from the matrix; and training the neural network model using the mapped substitute sub-vectors until a stop condition is reached.

2. The computer-implemented method of claim 1 wherein the vector is an input word embedding vector, an output word embedding vector, or both.

3. The computer-implemented method of claim 1 wherein the step of mapping the part to a substitute sub-vector further comprises forming a mapping table and the mapping table is fixed during training but the one or more parameters of each substitute sub-vector are subject to updating during training.

4. The computer-implemented method of claim 1 wherein the step of mapping the part to a substitute sub-vector comprises:

initializing a list of substitute sub-vector indicators, the list comprising a same number of entries for a sub-vector indicator as there are parts in the vector;

shuffling the list; and generating a mapping table from the shuffled list.

5. The computer-implemented method of claim 4 wherein the list is randomly shuffled.

6. The computer-implemented method of claim 1 wherein the step of mapping the part to a substitute sub-vector comprises:

using a pre-trained matrix to estimate sub-vectors to facilitate mapping of parts of the matrix with similar estimated sub-vectors to the same substitute sub-vector.

7. The computer-implemented method of claim 6 wherein the step of using a pre-trained matrix to estimate sub-vectors to facilitate mapping of parts of the matrix with similar estimated sub-vectors to the same substitute sub-vector comprises:

clustering parts of the pre-trained source embedding matrix into a plurality of clusters; and mapping the parts of the matrix that correspond to parts of the pre-trained matrix that were in the same cluster to the same substitute sub-vector.

8. The computer-implemented method of claim 7 wherein the number of clusters in the plurality of clusters corresponds to the number of substitute sub-vectors.

9. A computer-implemented method for compressing embedding of a neural network model, the method comprising:

dividing each word embedding vector of an embedding matrix having V word embedding vectors into K parts, K being a number larger than 1, each part comprising at least two elements;

for each part of the V*K parts of the embedding matrix, mapping the part to one of M substitute sub-vectors comprising one or more parameters, wherein M is a number less than V*K; and training the neural network model using the mapped substitute sub-vectors.

10. The computer-implemented method of claim 9 wherein each word embedding vector is divided into K parts evenly.

11. The computer-implemented method of claim 9 wherein the step of mapping the part to one of M substitute sub-vectors comprises:

initializing a list of V*K sub-vector indicator entries, each indicator entry representing one of the M substitute sub-vectors;

randomly shuffling the list; and generating a mapping table from the randomly shuffled list.

12. The computer-implemented method of claim 9 wherein the step of mapping the part to one of M substitute sub-vectors comprises:

using a pre-trained embedding matrix to estimate sub-vectors to facilitate mapping of parts of the embedding matrix with similar estimated sub-vectors to the same substitute sub-vector.

13. The computer-implemented method of claim 11 wherein the step of using a pre-trained embedding matrix to estimate sub-vectors to facilitate mapping of parts of the embedding matrix with similar estimated sub-vectors to the same substitute sub-vector comprises:

clustering parts of the pre-trained embedding matrix into a plurality of clusters; and mapping the parts of the embedding matrix that correspond to parts of the pre-trained embedding matrix that were in the same cluster to the same substitute sub-vector.

14. The computer-implemented method of claim 9 wherein the step of mapping the parts to one of M substitute sub-vectors further comprises forming a mapping table and the mapping table is fixed during training but the one or more parameters of each substitute sub-vectors are subject to updating during training.

15. A computer-implemented method for compressing an output word embedding layer of a neural network model, the method comprising:

mapping an output embedding vector into K sub-vectors, K being a number larger than 1, each part comprising at least two elements;

dividing a hidden vector of the neural network model into K parts;

for each pair in a set of pairs, obtaining and storing a partial dot product for the pair, in which a pair comprises a hidden vector part and a corresponding output embedding sub-vector;

for a word, using at least some of the stored partial dot products, which are selected according to the mapping, to obtain a sum value; and normalizing the sum value by a softmax non-linearity function in a softmax layer in the neural network model to obtain an output probability for the word.

16. The computer-implemented method of claim 15 wherein the K sub-vectors are respectively selected from K non-overlap sub-vector sets.

17. The computer-implemented method of claim 15 wherein the K sub-vectors are uniformly mapped.

18. The computer-implemented method of claim 15 wherein the neural network model is a recurrent neural model.

19. The computer-implemented method of claim 15 wherein the K sub-vectors are estimated by pre-training an output embedding matrix and are assigned using a clustering method.

20. The computer-implemented method of claim 19 wherein the K sub-vectors are shared with an input word embedding layer of the neural network model.

* * * * *